US006752238B2

(12) United States Patent
Small et al.

(10) Patent No.: US 6,752,238 B2
(45) Date of Patent: Jun. 22, 2004

(54) WATER RESISTANT AUDIBLE TOYS WITH SOUND EFFECTS

(75) Inventors: David Small, San Jose, CA (US); Paul S. Rago, Danville, CA (US)

(73) Assignee: Shoot the Moon Products 11, LLC, Pleasanton, CA (US)

(*) Notice: Subject to any disclaimer, the term of this patent is extended or adjusted under 35 U.S.C. 154(b) by 0 days.

(21) Appl. No.: 10/098,248

(22) Filed: Mar. 14, 2002

(65) Prior Publication Data

US 2002/0092864 A1 Jul. 18, 2002

Related U.S. Application Data

(63) Continuation of application No. 09/679,722, filed on Oct. 4, 2000, now Pat. No. 6,412,594.

(60) Provisional application No. 60/157,879, filed on Oct. 5, 1999.

(51) Int. Cl.[7] .......................... H05K 5/00; A47B 81/06; A63H 33/30; A63H 3/18; B65D 83/00

(52) U.S. Cl. ....................... 181/149; 181/199; 446/473; 222/79; 222/401

(58) Field of Search ............................ 446/473; 222/79, 222/401; 181/156, 160, 199, 149

(56) References Cited

U.S. PATENT DOCUMENTS

| | | | | |
|---|---|---|---|---|
| 2,453,192 A | | 11/1948 | Bryant | |
| 2,938,512 A | | 5/1960 | Smolen | |
| 3,014,099 A | | 12/1961 | Fiala | |
| 3,076,520 A | | 2/1963 | Farwell | |
| 3,162,813 A | | 12/1964 | Piccinini | |
| 3,163,330 A | | 12/1964 | Ryan | |
| 3,202,318 A | | 8/1965 | Black | |
| 3,345,607 A | | 10/1967 | Nelkin et al. | |
| 3,365,838 A | | 1/1968 | Butler | |
| 3,539,735 A | | 11/1970 | Marchand | |
| 3,652,810 A | | 3/1972 | Weingartner | |
| 3,674,108 A | | 7/1972 | Beatty | |
| 3,789,166 A | | 1/1974 | Sebesta | |
| 3,987,258 A | | 10/1976 | Tsutsui et al. | |
| 4,123,622 A | | 10/1978 | MacLeod | |
| 4,239,129 A | | 12/1980 | Esposito | |
| 4,562,590 A | | 12/1985 | DeLage | |
| 4,591,071 A | | 5/1986 | Johnson | |
| 4,682,363 A | | 7/1987 | Goldfarb et al. | |
| 4,714,133 A | | 12/1987 | Skags, Jr. | |
| 4,750,641 A | | 6/1988 | Chin-Fu | |
| 4,757,548 A | | 7/1988 | Fenner, Jr. | |
| 4,757,946 A | | 7/1988 | Johnson | |
| 4,854,480 A | | 8/1989 | Shindo | |
| 4,856,087 A | | 8/1989 | Nesbit | |
| 4,867,208 A | * | 9/1989 | Fitzgerald et al. | 141/18 |
| 4,889,208 A | | 12/1989 | Sugihara | |

(List continued on next page.)

FOREIGN PATENT DOCUMENTS

FR 2 251 976 11/1974

*Primary Examiner*—Rina Duda
*Assistant Examiner*—Patrick Miller
(74) *Attorney, Agent, or Firm*—Blakely Sokoloff Taylor & Zafmann

(57) ABSTRACT

A water resistant audible toy, such as a toy water gun, includes a speaker having a water resistant speaker cone. The water resistant audible toy includes a switch to activate the speaker to generate sounds. The water resistant audible toy may further include a light to generate lighting effects and a motor to generate a vibration. A pressure equalizer may be further included in the water resistant audible toy. Seals may be provided as part of the water resistant audible toy. The toy water gun includes a trigger to actuate the switch. The speaker may be part of a water resistant sound effects module.

41 Claims, 5 Drawing Sheets

U.S. PATENT DOCUMENTS

| | | | | | |
|---|---|---|---|---|---|
| 4,926,398 | A | | 5/1990 | Fincher | |
| 4,949,386 | A | | 8/1990 | Hill | |
| 4,980,707 | A | | 12/1990 | Gell, Jr. | |
| 4,987,597 | A | | 1/1991 | Haertl | |
| 4,994,800 | A | * | 2/1991 | Milliken | 340/901 |
| 5,130,693 | A | * | 7/1992 | Gigandet | 340/815.69 |
| 5,219,096 | A | | 6/1993 | Wing | |
| 5,283,970 | A | * | 2/1994 | Aigner | 42/57 |
| 5,285,894 | A | | 2/1994 | Kamata et al. | |
| 5,305,919 | A | | 4/1994 | Johnson et al. | |
| 5,339,987 | A | | 8/1994 | D'Andrade | |
| 5,346,418 | A | * | 9/1994 | Arad | 446/91 |
| 5,473,700 | A | | 12/1995 | Fenner, Jr. | |
| 5,650,591 | A | | 7/1997 | Matsushita et al. | |
| 5,662,244 | A | | 9/1997 | Liu et al. | |
| 5,735,440 | A | | 4/1998 | Regalbuto | |
| 5,802,192 | A | | 9/1998 | Katakawa | |
| 5,902,162 | A | | 5/1999 | Kot et al. | |
| 5,903,658 | A | * | 5/1999 | Okazaki et al. | 381/428 |
| 6,014,347 | A | | 1/2000 | Mignot et al. | |
| 6,018,585 | A | | 1/2000 | Akino et al. | |
| 6,079,515 | A | * | 6/2000 | Newman | 181/156 |
| 6,128,394 | A | | 10/2000 | Hayakawa et al. | |
| 6,188,773 | B1 | | 2/2001 | Murata et al. | |
| 6,202,242 | B1 | * | 3/2001 | Salmon et al. | 15/22.1 |
| 6,219,304 | B1 | | 4/2001 | Mignot et al. | |
| 6,280,277 | B1 | | 8/2001 | Greenberg et al. | |
| 6,390,232 | B1 | * | 5/2002 | Kirschbaum | 181/169 |
| 6,412,594 | B1 | * | 7/2002 | Small et al. | 181/149 |
| 6,474,507 | B1 | * | 11/2002 | Hornsby et al. | 222/79 |
| 2002/0132557 | A1 | * | 9/2002 | Yu | 446/475 |

* cited by examiner 2a
2c
2e
2g
24
26
28
29
30
31
32
33
34
36
37
38
39
40
48
50
52
202
204
206
208

5c
5e
5g
5a

WATER RESISTANT AUDIBLE TOYS WITH SOUND EFFECTS

CROSS-REFERENCE TO RELATED APPLICATIONS

This United States (U.S.) non-provisional patent application filed by inventors David Small et al is a continuation and claims the benefit of U.S. non provisional patent application Ser. No. 09/679,722, filed by inventors David Small et al on Oct. 04, 2000, entitled “WATER GUN WITH SOUND EFFECTS MODULE”, now U.S. Pat. No. 6,412, 594 B1, which claims the benefit of U.S. provisional patent application Serial No. 60/157,879, filed by inventors David Small et al on Oct. 5, 1999, entitled “WATER GUN WITH SOUND EFFECTS MODULE”.

DETAILED DESCRIPTION OF THE PREFERRED EMBODIMENT

Figure 1:
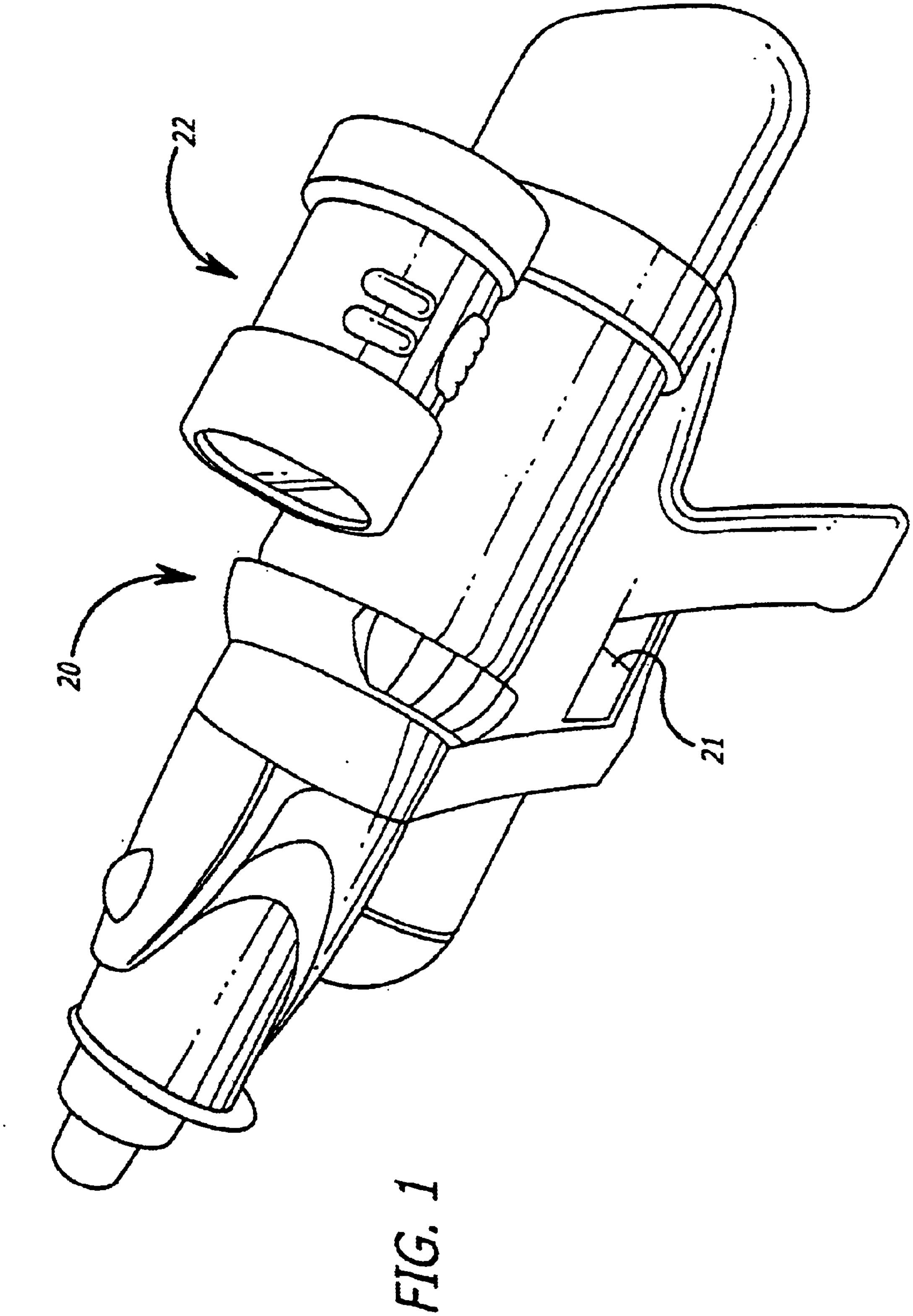
FIG. 1 is a view of an exemplary embodiment of the present invention.

Referring to FIG. 1, a water gun generally indicated by the numeral 20 is provided with a sound effects module, generally indicated by the numeral 22, to provide sound effects in conjunction with the operation of the water gun. In a typical application, the water gun will be of the elastic bladder type, wherein water is forced into the bladder to expand the bladder, with water being expelled from the gun on pulling the trigger of the water gun as a result of the elasticity of the bladder. Water guns of this general type are well known in the art, with merely a sample of such devices being disclosed in U.S. Pat. Nos. 4,591,071, 4,854,480, 5,219,096, 5,735,440 and 5,902,162.

The sound effects module 22 in a typical application will be connected to a switch actuated by the trigger 21 of the water gun 20, so that the sound effects will be coincidental with the discharge of water from the water gun 20. Such sound effects may be fixed, such as simulating a machine gun or the like, or may be user selectable to simulate various real and/or imaginary weapons, such as machine guns, laser or other beam type weapons, other weapons of science fiction, etc. In that regard, any of various sound signal generating devices may be used, such as by way of example, single chip analog or digital storage and playback devices, such as, by way of example, the analog storage and playback devices manufactured by Information Storage Devices, Inc. of San Jose, Calif.

It is important to note that implementing an air-tight compression chamber to achieve a waterproof environment is not advisable as pressure differentials between the front and rear of the speaker caused from air freight or heat variations would cause the speaker to deform or potentially become damaged. Pressure differentials across the speaker will cause the speaker to have significant distortion during operation.

In the water gun environment, it is important that the sound effects module is capable of operation in a wet and humid environment and over some significant temperature range, as the water gun 20 may be exposed to relatively cool tap water or left in the sun on a summer day to warm up to 50–75° Fahrenheit above cool tap water temperatures. Accordingly, it is desired to have the sound effects module be water resistant. While absolute water resistance, which might be referred to as “waterproof,” would be ideal, the cost of achieving absolute water resistance may not be justified from an economic standpoint nor required from a functional standpoint.

FIGS. 2*a*–2*g*, 3*a*–3*g*, 4*a*–4*g*, and 5*a*–5*g*, disclose four exemplary alternate approaches for achieving the desired water resistance of the sound effects module 22. As is representative of the embodiments of FIGS. 2*a*–2*g*, 3*a*–3*g*, 4*a*–4*g*, and 5*a*–5*g*, FIGS. 2*a*–2*g* illustrate the general construction of the sound effects module. In particular, adjacent one end of the sound effects module housing 24 is a mylar speaker 26, sealed around a periphery to the module housing 24 by the configuration of the speaker cover 28. The mylar speaker 26 has an electromechanical actuator 50 and a speaker cone 52 made of mylar or other water impermeable material. The actuator 50 converts electrical signals to mechanical vibrations. The speaker cone 52 is glued to the actuator 50 so that vibrations of the actuator 50 propagate into the speaker cone 52. The speaker cover 28 provides protection from mechanical damage for the mylar speaker 26 while also having openings to allow sound created by the mylar speaker 26 to propagate from the speaker cone 52.

Figures 2A, 2B, 2C, 2D, 2E, 2F, 2G:
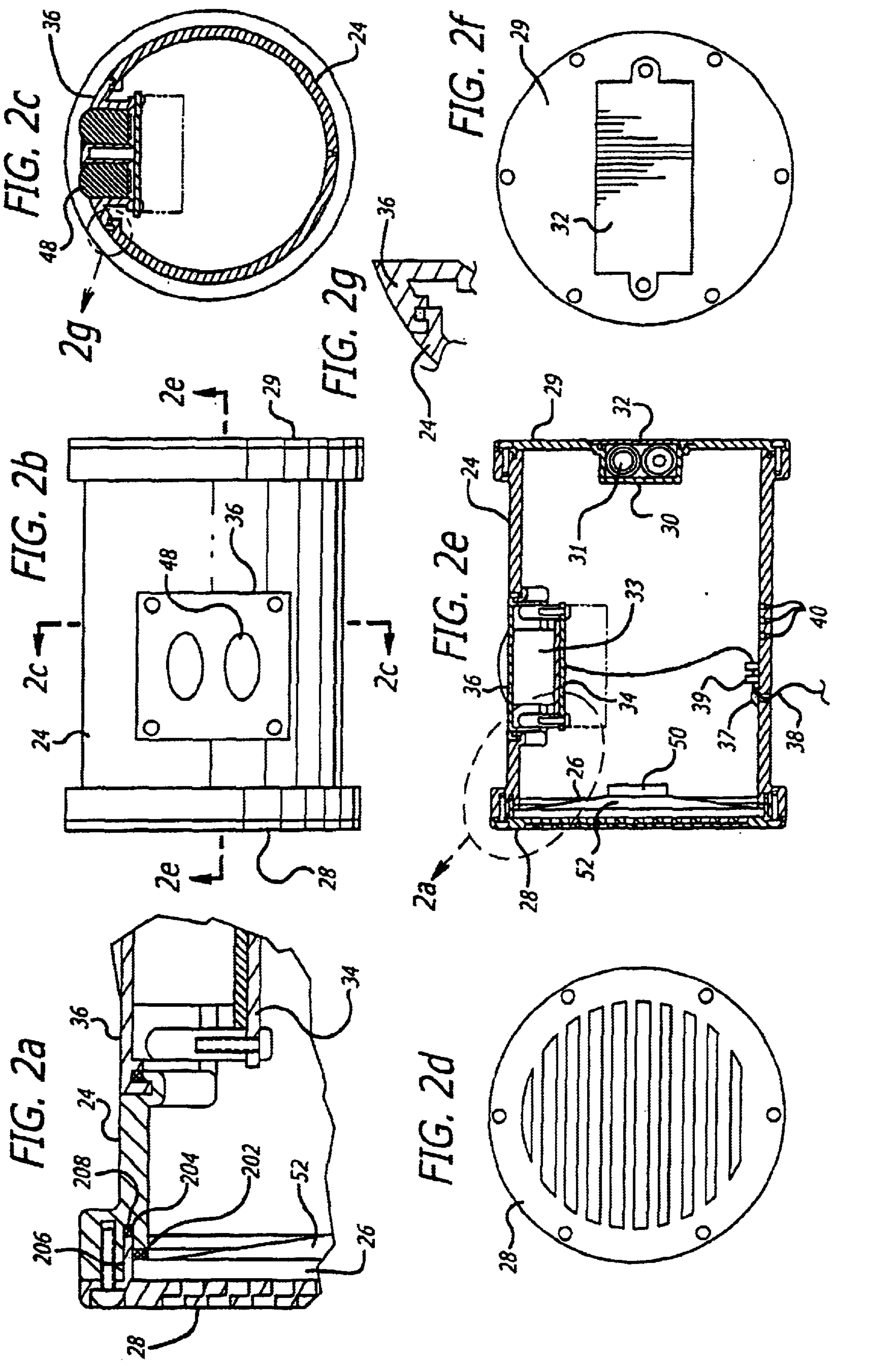
FIGS. 2*a* through 2*g* are views of one embodiment of a sound effects module in accordance with the present invention.

FIG. 2*d* illustrates an exemplary configuration of the speaker cover 28. FIGS. 2*a*–2*f* illustrate the mylar speaker 26, the speaker cover 28, the module housing 24, a speaker seal 202, a speaker cover seal 204, a ring 206 of the speaker cover 28 and a land 208 of the module housing 24. The mylar speaker 26 closes the end of the module housing 24 so that speaker cone 52 prevents water from entering the module housing. FIGS. 2*a*, 3*a*, 4*a*, and 5*a* are magnified views of the seals that may be provided around the speaker cover 28, the mylar speaker 26 and the module housing 24 in each embodiment. The seal between the end cover 29 and the module housing 24 may be similar to that of the seal provided between the speaker cover 28 and the module housing 24. The seal between the removable battery door 32 and the end cover 29 may be similar to that of the seal provided between the speaker cover 28 and the module housing 24. FIGS. 2*g*, 3*g*, 4*g*, and 5*g* are magnified views of the seals that may be provided between the cover 36 and the module housing 24 in each embodiment. The seal between the cover 36 and the module housing 24 may be similar to that of the seal provided between the speaker cover 28 and the module housing 24.

The speaker cover 28 is fastened to the module housing 24 by fasteners, threads formed on the speaker cover 28 and the module housing 24 or other attachment devices well known in the art. The speaker cover 28 captures the mylar speaker 26 and presses the mylar speaker 26 against the speaker seal 202. The speaker seal 202 in one embodiment is an “O” ring type of seal. Thus, the mylar speaker 26 and the module housing 24 compress the speaker seal 202 to seal the module housing 24 and mylar speaker 26. The sound effects module 22 may also include a speaker cover seal 204. Speaker cover 28 may have a tongue, projection or ring 206 which presses the speaker cover seal 204 against the groove, race or land

208 thereby sealing the ring 206 and land 208. While both speaker seal 202 and speaker cover seal 204 have been shown, it is understood that only the speaker seal 202 is required to seal the mylar speaker 26 and module housing 24.

At the other end of the sound effects module 22 is an end cover 29 with a battery case 30. A removable battery door 32 couples to the end cover 29 sealing the periphery of the battery case 30. Batteries 31 may be installed in the battery case. The batteries 31 are electrically connected to circuitry such as a printed circuit board in a compartment 33. The compartment 33 is sealed at the bottom with a first cover 34 and sealed at the top with a second cover 36, having a silicon rubber keypad 48 thereon for, sound effects selection, etc., the exact configuration of which will depend upon the sounds effects module, the selections it provides, etc. Covers 34 and 36 typically enclose a printed circuit board with the sound effects device or devices and any supporting circuitry required thereon in a manner to seal the same from both the volume within the sound effects module and the exterior thereof.

In general, the sealing of the various components making up the module will be by way of o-rings or other elastic seals. For those components which do not need to be disassembled for any reason, alternate assembly techniques, such as ultrasonic welding, solvent welding, or the like could be used. In any event, the output of the electronics generating the sound signal is coupled to the actuator 50 of the mylar speaker 26 through leads not shown, with leads 38 being connected to the trigger switch for turning on the sound effects module when the trigger of the water gun is pulled. The leads 38 extending through the housing 24 to the trigger switch may be sealed by a silicon seal 37 and provided with a strain relief 39. These basic components, shown in exemplary embodiment form, are in one way or another common to all four exemplary embodiments of FIGS. 2*a*–2*g*, 3*a*–3*g*, 4*a*–4*g*, and 5*a*–5*g*.

In the embodiment of FIGS. 2*a*–2*g*, small holes 40 are provided through the lower wall of the module housing 24 to allow the interior volume of the sound effects module (other than the compartments sealed by covers 34 and 36) to breathe, allowing the internal pressure within the greater volume of the sound effects module 22 to equal atmospheric pressure. In that regard, it is important that that interior chamber be at or near the outside ambient pressure, as otherwise the speaker cone 52 of the mylar speaker 26 will have a pressure differential there across, providing a stress on the speaker cone and causing a high degree of distortion in the sound generated, in an extreme, perhaps even doing permanent damage to the speaker. At normal operating frequencies of the speaker, however, the holes 40 are too small to allow appreciable flow, so that the internal volume of the sound effects module will act much like a sealed chamber, enhancing the output of the speaker at and near the natural frequency of the speaker/sound effects module air volume.

Figures 3A, 3B, 3C, 3D, 3E, 3F, 3G:
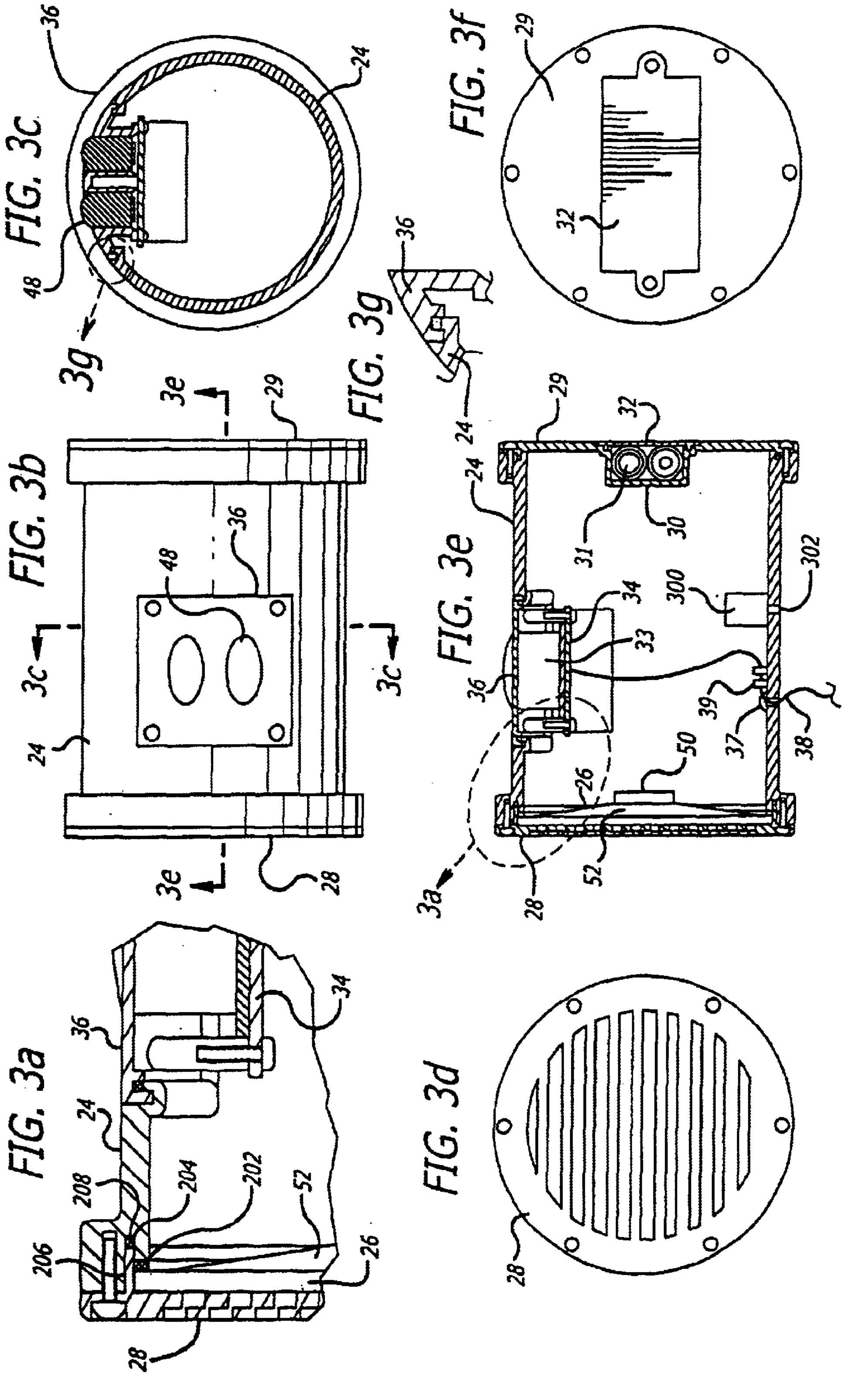
FIGS. 3*a* through 3*g* are views of another embodiment of a sound effects module in accordance with the present invention.

In the embodiment of FIGS. 3*a*–3*g*, specifically as shown in FIG. 3*e*, a pair of one-way valves 300 is provided which prevents the buildup of pressure within the sound effects module housing, though prevents water from entering the housing. A hole 302 in the housing 24 allows pressure within the sound effects module to be equalized through the pair of one-way valves 300. Various types of one way valves 300 could be used, such as, by way of example, duck bill rubber valves or ball check valves. Such an embodiment would block water flow into the interior of the module, but tend to allow air flow into and out of the interior region. The one way valves are arranged so that one valve allows air to flow into the chamber and the other valve allows air to flow out of the chamber. These valves operate in concert to maintain the pressure of the internal compression chamber at equilibrium with atmospheric pressure.

Figures 4A, 4B, 4C, 4D, 4E, 4F, 4G:
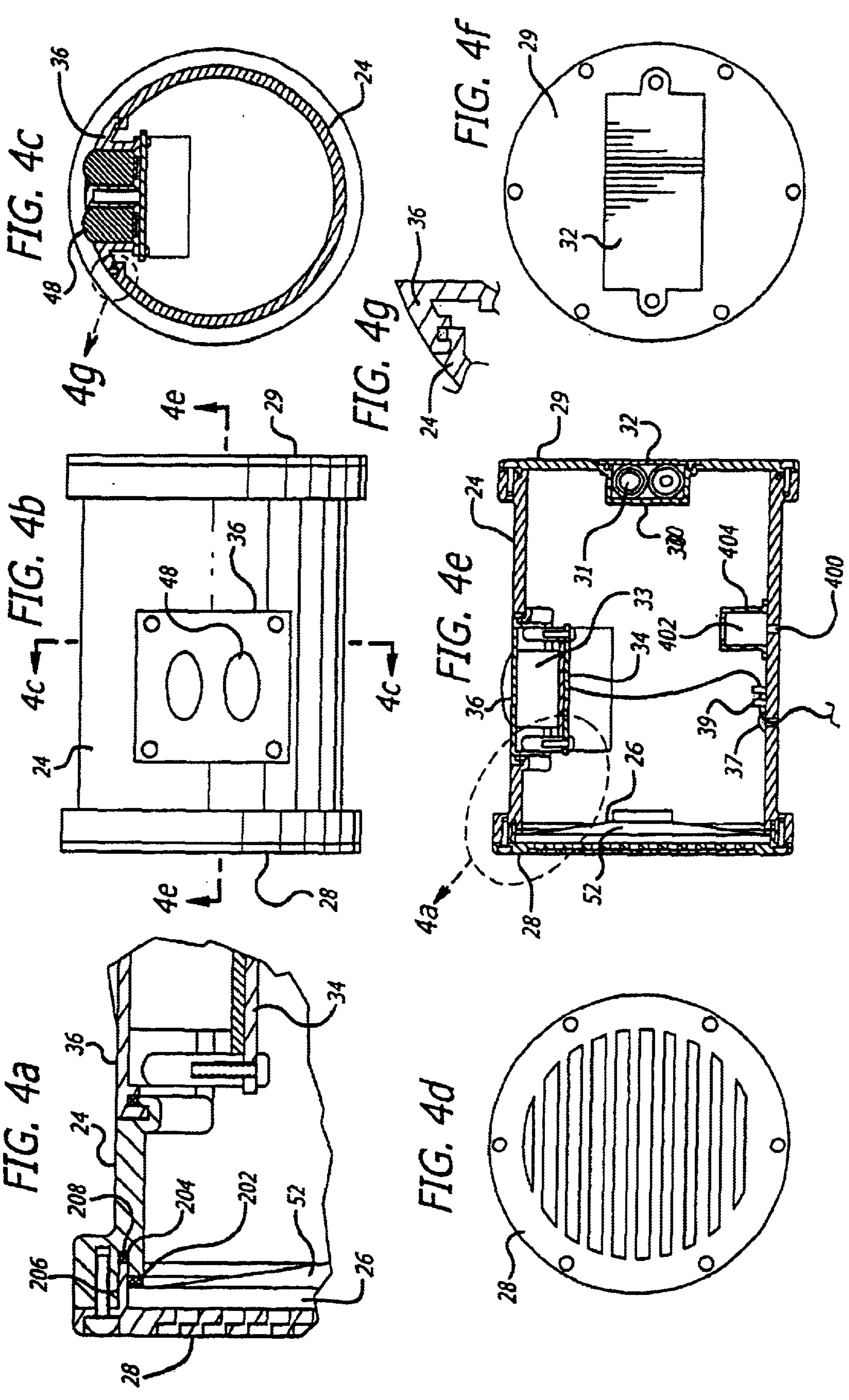
FIGS. 4*a* through 4*g* are views of still another embodiment of a sound effects module in accordance with the present invention.

In the embodiment of FIGS. 4*a*–4*g*, as specifically shown in FIG. 4*e*, a hole 400 is provided through the case with a semipermeable filter member 402 mounted therein to allow the passage of air, but not the passage of water, into and out of the interior volume of the sound effects module. The air flow through such a semipermeable filter of the various types as are well known is fairly restricted, so as to have no significant effect on the acoustic properties of the system at the desired frequencies of the sound effects generated by the speaker.

Figures 5A, 5B, 5C, 5D, 5E, 5F, 5G:
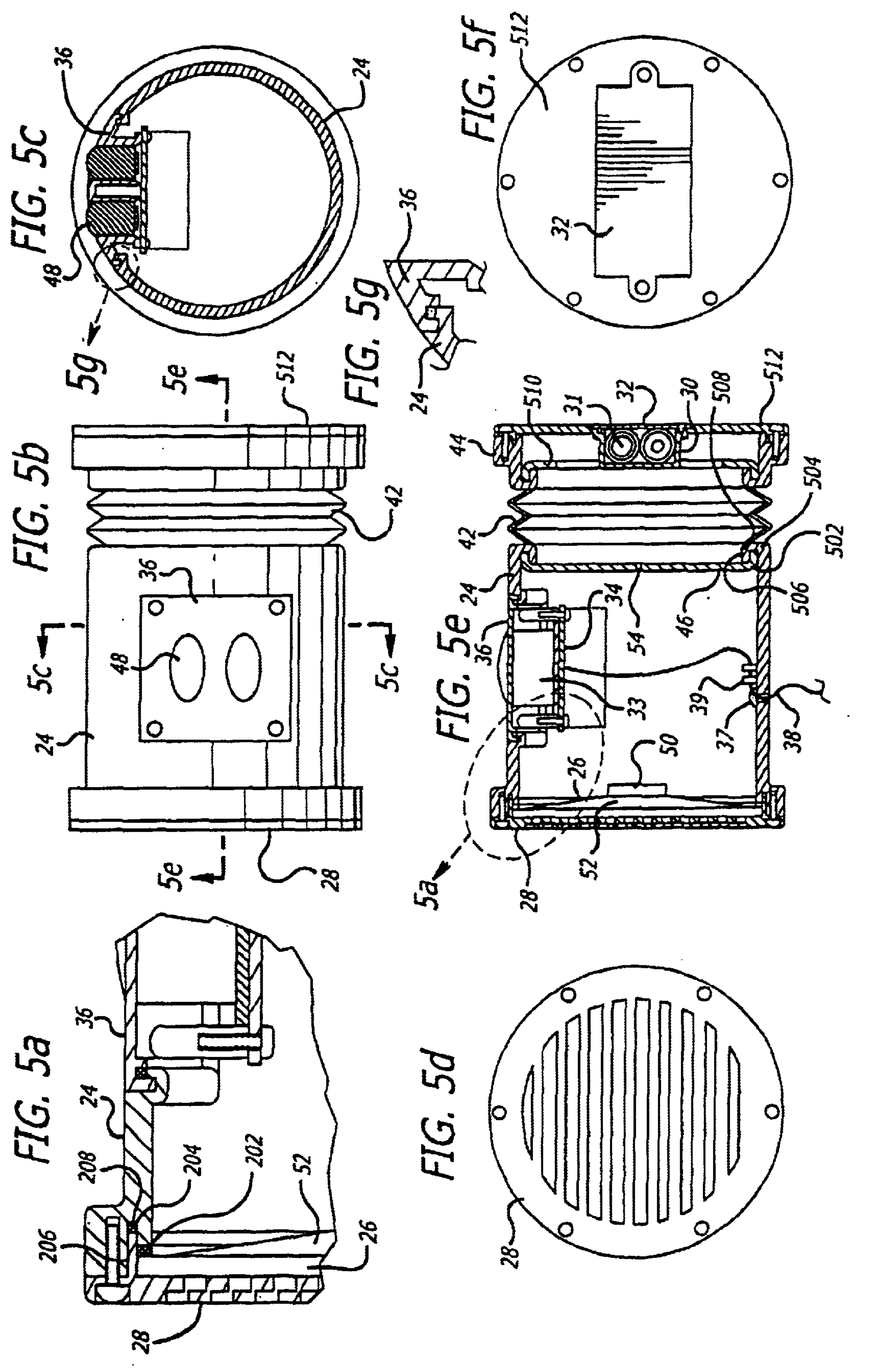
FIGS. 5*a* through 5*g* are views of still another embodiment of a sound effects module in accordance with the present invention.

In the embodiment shown in FIGS. 5*a*–5*g*, specifically FIGS. 5*b* and 5*e*, expansion and contraction of the air within the sound effects module is compensated for by the flexibility of the module housing 24 itself, specifically by the imposition of an accordion type flexible member 42, sealed with respect to the module housing 24 and end member 44. A restriction plate 46 in this embodiment closes off most of the end of module housing 24 to define the internal volume of air behind the speaker for acoustic purposes, with a small hole 54 in member 46 allowing very low frequency breathing between the volume behind the speaker cone 52 and the volume enclosed by the flexible member 42 to equalize pressures there between. Thus this embodiment, like the others, maintains the acoustic characteristics of the mylar speaker/air chamber there behind, while at the same time, provides even better water resistance for the sound effects module.

FIGS. 5*a*–5*f* illustrate the flexible member 42, the restriction plate 46, the end member 44, a seal plate 510 and a cover 512. To assemble the flexible member 42 to the module housing 24, the flexible member 42 is presented at the end of the module housing 24. A skirt 506 of the flexible member 42 is fitted over the lip 508 of the module housing 24. The skirt 506 may be made from an elastomeric material. A restriction plate 46 is slid into the other end of the module housing 24. The restriction plate 46 is then screwed into the end of the module housing 24 thereby capturing and compressing the skirt 506. Thus the skirt 506 seals the flexible member 42 and the module housing 24. The end member 44 is presented to the flexible member 42. A seal similar to the module housing 24 and flexible member 42 may be formed between the end member 44 and flexible member 42 using the seal plate 510. A cover 512 with battery case 30 and removable battery door 32 is sealed to the end member 44.

In another embodiment, the restriction plate may have a tongue 502 and the module housing 24 may have a groove 504. Restriction plate 46 is pushed toward the accordion end of the module housing so that tongue 502 engages groove 504. Thus the tongue 502 and groove 504 capture and compress the skirt 506 to seal the flexible member 42 and the module housing 24. In another embodiment, the flexible member 42 is coupled to module housing 24 by ultrasonic welding, solvent welding or the like.

In the embodiments described herein, the basic sound effects generation has been described with respect to some form of electronic sound effects generator. Other types of sound effects generation and effects of other types may also be generated by the water resistant module of the present invention. By way of example, the sound effects module might have mounted therein a motor with an eccentric weight to introduce a vibration instead of, or in addition to, the sound effects, the eccentric weight simulating the recoil of a machine gun type device. As a further alternative, the eccentric weight might be comprised of one or more washer type rings on an eccentric pin, positioned to intercept a rigid wall or end of the sound effects chamber, so as to create a firing noise every time the washer or washers strike the end wall on each rotation of the eccentric, thus generating both the desired noise and vibration from the same device. Other alternatives may include lights, pumps or other devices protected within the water resistant module. These and other alternate embodiments will be apparent to those skilled in the art. Thus, while the present invention has been disclosed and described with respect to certain specific embodiments thereof, it will be understood by those skilled in the art that various changes in form and detail may be made therein without departing from the spirit and scope of the invention.

What is claimed is:

1. A toy water gun comprising:

a water container to contain water to be expelled out of the water container and the toy water gun;

a trigger to be moved by a finger;

a water resistant sound effects module including, a housing having a first opening and an interior volume, a speaker having a water resistant speaker cone, the speaker to cover the first opening of the housing and to generate sound, and a first seal coupled between the speaker and the housing to provide a water resistant seal; and a switch to turn on the water resistant sound effects module to generate sound in response to a movement of the trigger.

2. The toy water gun of claim 1, wherein the water resistant speaker cone of the water resistant sound effects module further to deter water from communicating into the interior volume.

3. The toy water gun of claim 1, wherein the water resistant sound effects module further includes a speaker cover to protect the water resistant speaker cone and having openings to allow sound to propagate from the speaker cone.

4. The toy water gun of claim 3, wherein the water resistant sound effects module further includes a second seal coupled between the speaker cover and the housing around the first opening to provide a water resistant seal.

5. The toy water gun of claim 1, wherein the water resistant sound effects module further includes a sealed compartment having a printed circuit board with a sound effects device, the sound effects device to generate a sound signal in response to the movement of the trigger switch, and wherein, the speaker to generate sound in response to the sound signal.

6. The toy water gun of claim 5, wherein the sealed compartment of the water resistant sound effects module further has a keypad electrically coupled to the printed circuit board to select sound effects, the sound effects device further to generate the sound signal in response to the selection of sound effects by the keypad.

7. The toy water gun of claim 6, wherein the selectable sound effects include sounds to simulate a machine gun, a pistol, a rifle, a shot gun, a laser gun, and a ray gun.

8. The toy water gun of claim 1, wherein the water resistant sound effects module further includes a battery case to contain batteries to power the sound effects module, and a removable battery door to seal the battery case and to provide access to batteries contained within the battery case.

9. The toy water gun of claim 1, wherein the water resistant sound effects module further includes a motor with an eccentric weight to introduce a vibration to the toy water gun.

10. The toy water gun of claim 9, wherein the vibration introduced by the motor with the eccentric weight to simulate recoil of a gun.

11. The toy water gun of claim 1, wherein the water container is an elastic bladder.

12. The toy water gun of claim 1, further comprising:

a light to generate lighting effects.

13. The toy water gun of claim 12, wherein the switch to further cause the light to generate the lighting effects in response to the movement of the trigger, coincident with the generation of sound by water resistant sound effects module.

14. The toy water gun of claim 1, wherein the water is expelled out of the water container and the toy water gun in response to the movement of the trigger.

15. The toy water gun of claim 14, wherein the switch to turn on the water resistant sound effects module to generate sound in response to the movement of the trigger, coincident with the expulsion of water out from the toy water gun.

16. The toy water gun of claim 1, wherein the switch is directly responsive to the trigger and turns on the water resistant sound effects module to generate sound in direct response to the movement of the trigger.

17. A toy water gun comprising:

a water container to contain water;

a trigger to expel water out of the water container and the toy water gun in response to a movement of the trigger;

a water resistant sound effects module including, a housing having a first opening and an interior volume, a speaker having a water resistant speaker cone, the speaker to cover the first opening of the housing and to generate sound, a first seal coupled between the speaker and the housing to provide a water resistant seal, and a pressure equalizer to equalize a pressure differential between an internal gas pressure of the interior volume and an atmospheric gas pressure; and a switch to turn on the water resistant sound effects module to generate sound in response to the movement of the trigger.

18. The toy water gun of claim 17, wherein the pressure equalizer further to deter water from communicating into the interior volume.

19. A water resistant audible toy comprising:

a housing having a first opening and a first interior volume, the housing formed of water resistant material;

a speaker having a water resistant speaker cone to generate sounds, the speaker coupled to the housing and covering the first opening of the housing to deter water from entering the first interior volume;

a first O-ring seal coupled between the speaker and the housing; and a switch to activate the speaker to generate sounds.

20. The water resistant audible toy of claim 19, further comprising:

an electrical component electrically coupled between the switch and the speaker, the electrical component to generate an electrical sound signal to couple to the speaker to generate sound.

21. The water resistant audible toy of claim 20, further comprising:

a first water resistant compartment to enclose the electrical component and to deter water from entering the first water resistant compartment and reaching the electrical component.

22. The water resistant audible toy of claim 20, further comprising:

a light coupled to the electrical component, the light to generate lighting effects.

23. A water resistant audible toy comprising:

a housing having a first opening and a first interior volume, the housing formed of water resistant material;

a speaker having a water resistant speaker cone to generate sounds, the speaker coupled to the housing and covering the first opening of the housing to deter water from entering the first interior volume;

a first O-ring seal coupled between the speaker and the housing;

a switch to activate the speaker to generate sounds; and a pressure equalization device to deter gas from communicating between the first interior volume and the environment at sonic frequencies and to deter water from entering the first interior volume.

24. The water resistant audible toy of claim 23, wherein the first pressure equalization device is selected from the group consisting of a semipermeable filter, a pair of one way valves, and a hole.

25. A water resistant audible toy comprising:

a housing having a first opening, a second opening, and a first interior volume, the housing formed of water resistant material;

a speaker having a water resistant speaker cone to generate sounds, the speaker coupled to the housing and covering the first opening of the housing to deter water from entering the first interior volume;

a first O-ring seal coupled between the speaker and the housing;

a switch to activate the speaker to generate sounds; and an expandable member formed of water resistant material, the expandable member to close the second opening of the housing, the expandable member having a second interior volume to communicate with the first interior volume.

26. The water resistant audible toy of claim 25, further comprising:

a restriction plate between the housing and the expandable member, the restriction plate having a hole to allow the first interior volume and the second interior volume to communicate at subsonic frequencies.

27. A water resistant audible toy comprising:

a housing having a first opening, a second opening, and a first interior volume, the housing formed of water resistant material;

a speaker having a water resistant speaker cone to generate sounds, the speaker coupled to the housing and covering the first opening of the housing to deter water from entering the first interior volume;

a first O-ring seal coupled between the speaker and the housing;

a switch to activate the speaker to generate sounds;

an electrical component electrically coupled between the switch and the speaker, the electrical component to generate an electrical sound signal to couple to the speaker to generate sound;

a keypad coupled to the housing to close the second opening, the keypad electrically coupled to the electrical component to select sound effects; and, a second O-ring seal coupled between the keypad and the housing.

28. A water resistant audible toy comprising:

a housing having a first opening and an interior volume;

a speaker having a water resistant speaker cone to deter water from communicating into the interior volume, the speaker to cover the first opening of the housing and to generate sound;

a first seal coupled between the speaker and the housing to provide a water resistant seal;

a pressure equalizer to equalize a pressure differential between an internal gas pressure of the interior volume and an atmospheric gas pressure and to deter water from communicating into the interior volume;

a light to generate lighting effects; and a switch to cause the speaker to generate sound and the light to generate lighting effects.

29. The water resistant audible toy of claim 28, further comprising:

a motor with an eccentric weight to generate a vibration.

30. The water resistant audible toy of claim 28, further comprising:

a speaker cover to protect the water resistant speaker cone and having openings to allow sound to propagate from the speaker.

31. The water resistant audible toy of claim 30, further comprising a second seal coupled between the speaker cover and the housing around the first opening to provide a water resistant seal.

32. The water resistant audible toy of claim 28, further comprising:

a sealed compartment having a printed circuit board with a sound effects device, the sound effects device to generate a sound signal to couple to the speaker, and wherein, the speaker to generate sound in response to the sound signal.

33. The water resistant audible toy of claim 32, wherein the sealed compartment further has a keypad electrically coupled to the printed circuit board to select sound effects, the sound effects device further to generate the sound signal in response to the selection of sound effects by the keypad.

34. The water resistant audible toy of claim 28, further comprising a water resistant battery case to contain batteries to power the water resistant audible toy and the generation of sound and lighting effects, and a removable battery door to seal the battery case and to provide access to batteries contained within the battery case.

35. The water resistant audible toy of claim 34, wherein the water resistant battery case has a removable battery door to seal the battery case and to provide access to batteries contained within the battery case.

36. A toy water gun comprising:

a housing having a first opening and an interior volume;

a speaker coupled to the housing around the first opening, the speaker having a water resistant speaker cone over the first opening, the speaker to generate audible sounds in response to an electrical signal;

a first seal coupled between the speaker and the housing, the first seal to provide a water resistant seal between the speaker and the housing around the first opening;

a water container coupled to the housing, the water container to contain water;

a switch coupled to the housing, the switch to selectively couple the electrical signal to the speaker to generate audible sound; and a trigger to couple to the switch, the trigger to select the switch to selectively couple the electrical signal to the speaker to generate audible sound.

37. The toy water gun of claim 36, wherein the trigger further to allow water to be released from the water container and the toy water gun in response to a movement of the trigger.

38. The toy water gun of claim 36, wherein the water container is an elastic bladder.

39. A toy water gun comprising:

a housing having a first opening and an interior volume;

a speaker coupled to the housing around the first opening, the speaker having a water resistant cover over the first opening, the speaker to generate audible sounds in response to an electrical signal;

a first seal coupled between the speaker and the housing, the first seal to provide a water resistant seal between the speaker and the housing around the first opening;

a water container coupled to the housing, the water container to contain water;

a switch coupled to the housing, the switch to selectively couple the electrical signal to the speaker to generate audible sound; and a trigger to couple to the switch, the trigger to select the switch to selectively couple the electrical signal to the speaker to generate audible sound.

40. The toy water gun of claim 39, wherein the trigger further to allow water to be released from the water container and the toy water gun in response to a movement of the trigger.

41. The toy water gun of claim 39, wherein the water container is an elastic bladder.

* * * * *